United States Patent
Brunson et al.

(10) Patent No.: US 7,205,173 B2
(45) Date of Patent: Apr. 17, 2007

(54) METHOD OF FABRICATING MICRO-ELECTROMECHANICAL SYSTEMS

(75) Inventors: Kevin Michael Brunson, Malvern (GB); David James Hamilton, Malvern (GB); Robert John Tremayne Bunyan, Malvern (GB); Mark Edward McNie, Malvern (GB)

(73) Assignee: QinetiQ Limited (GB)

( * ) Notice: Subject to any disclaimer, the term of this patent is extended or adjusted under 35 U.S.C. 154(b) by 0 days.

(21) Appl. No.: 10/508,129

(22) PCT Filed: Mar. 19, 2003

(86) PCT No.: PCT/EP03/50071

§ 371 (c)(1),
(2), (4) Date: Sep. 16, 2004

(87) PCT Pub. No.: WO03/078301

PCT Pub. Date: Sep. 25, 2003

(65) Prior Publication Data

US 2005/0139871 A1 Jun. 30, 2005

(30) Foreign Application Priority Data

Mar. 20, 2002 (GB) .................................. 0206509.2

(51) Int. Cl.
*H01L 21/00* (2006.01)
(52) U.S. Cl. ..................... 438/48; 438/50; 438/372
(58) Field of Classification Search ............. 438/48–52
See application file for complete search history.

(56) References Cited

U.S. PATENT DOCUMENTS 4,873,868 A 10/1989 Pierre et al.

(Continued)

FOREIGN PATENT DOCUMENTS

EP 0 763 744 3/1997

(Continued)

OTHER PUBLICATIONS

Zou et al, "Design and Fabrication of a Novel Integrated Floating-Electrode-Electret-Microhphone", IEEE, pp. 586-590 (1998).

(Continued)

*Primary Examiner*—Dung A. Le
(74) *Attorney, Agent, or Firm*—McDonnell Boehnen Hulbert & Berghoff LLP (57) ABSTRACT

A MEMS incorporating a sensing element and a JFET electrically connected to the sensing element is fabricated by the steps of: forming a first layer of electrically insulating barrier material on a surface of a substrate; patterning the first layer so as to expose a first region of the substrate; doping by ion implantation the first region of the substrate to form a well region of the JFET; forming a second layer of barrier material on the surface of both the first layer and the first region of the substrate; patterning the barrier material so as to expose a part of the first region of the substrate; doping by ion implantation the exposed part of the first region of the substrate to form source and drain contact areas of the JFET; patterning the barrier material so as to expose a second region of the substrate; and doping by ion implantation the second region of the substrate to form gate and substrate contact areas of the JFET in a single implantion step. The monolithic integration of the JFET with the MEMS enables the bond wires for interconnecting the sensing element and the associated sensing electronic circuitry to be provided only after the buffering stage of such circuitry. This means that the bond wires interconnecting the buffering stage and the remainder of the circuitry are connected to a low impedance node which is less sensitive to noise and parasitic capacitive loading. Thus greater detection accuracy can be achieved by virtue of the fact that the parasitic capacitances are reduced to a minimum.

14 Claims, 5 Drawing Sheets

U.S. PATENT DOCUMENTS 5,576,250 A     11/1996   Diem et al.
6,133,059 A     10/2000   Werner
6,210,988 B1 *   4/2001   Howe et al. .................. 438/50

FOREIGN PATENT DOCUMENTS

| | | |
|---|---|---|
| GB | 2276976 | 10/1994 |
| JP | 07 294295 | 11/1995 |
| JP | 10-096745 | 4/1998 |
| JP | 2002-131059 | 5/2002 |
| WO | WO 00/16041 | 3/2000 |

OTHER PUBLICATIONS

Zou et al, "A Novel Integrated Silicon Capacitive Microphone-Floating Electrode Electret Microphone", Journal of Microelectromechanical Systems, pp. 224-233 (1998).

Bernstein et al. "A Micromachined Silicon Condenser Microphone with On-Chip Amplifier", Solid-State Sensor and Actuator Workshop, pp. 239-243 (1996).

* cited by examiner

METHOD OF FABRICATING MICRO-ELECTROMECHANICAL SYSTEMS

CROSS REFERENCE TO RELATED APPLICATIONS

This application is a 371 of PCT/EP03/50071 filed on Mar. 19, 2003.

This invention relates to micro-electromechanical systems (MEMS), and is concerned more particularly, but not exclusively, with such systems incorporating a sensing element and a junction field-effect transistor (JFET) electrically connected to a capacitive sensing element, and to a method of fabricating such a system.

In this specification the term "micro-electromechanical systems (MEMS)" is used to encompass a wide range of micromechanical sensors and actuators including those described in the art by the terms "Microsystems technology (MST)", "microrobotics" and "microengineered devices".

It is known to produce MEMS using micro-machining techniques. For example GB 2276976A discloses a particular method of production of such a system in which a silicon wafer has cavities formed in its surface, and a second wafer is then bonded to the surface of the first wafer prior to the second wafer being etched in a manner to release portions of the second wafer which are above the cavities in the first wafer. In this way a suspended resonating actuator is formed which can be actuated in response to mechanical movement and which can be sensed by a sensing element to provide an electrical output signal indicative of such movement. One such MEMS is the accelerometer disclosed in U.S. Pat. No. 5,576,250.

WO 95/08775 and WO 00/16041 also relate to features of fabrication of such MEMS.

Figure 1:
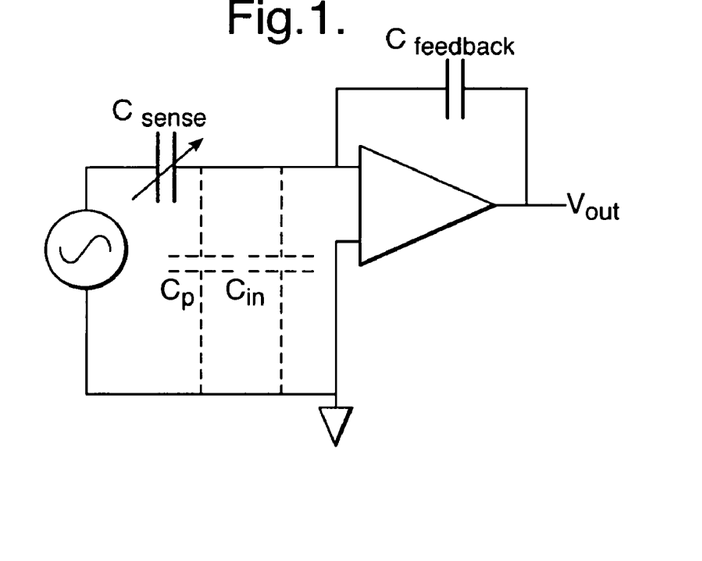
FIG. 1 is a circuit diagram of a typical capacitative detection circuit of a MEMS.

In MEMS the capacitances to be detected are often well below 1 pF and usually in the capacitance range of fF–nF. Thus the required detection accuracy may be extremely small, that is less than 10 aF. Thus it is extremely important that the signal-to-noise ratio in transforming the sensed signal to an electrical output signal is maximised so as to enable small signals to be detected. Furthermore, since the detected signal is typically at a high impedance node (i.e. small capacitance), the signal is highly sensitive to noise injection. The signal is also typically of such a low value that it may be significantly attenuated and potentially dominated by parasitics and/or the input capacitance of the amplifier for amplifying the detected signal. A simplified schematic diagram of a typical capacitive detection circuit is shown in FIG. 1 where $C_{sense}$ denotes the capacitance of the sensing element, 2 denotes a voltage source, 4 denotes the detection amplifier, $C_{feedback}$ denotes the feedback capacitance, $C_{in}$ denotes the input capacitance and $C_p$ denotes the parasitic capacitance. $V_{out}$ denotes the voltage of the electrical output signal.

Typically MEMS sensors are provided on stand-alone silicon chips and employ hybrid integration to interface to the sensing electronic circuitry, whether discrete electronic circuitry is used (e.g. pin-through-hole or surface-mount on a printed circuit board), or whether one or more integrated circuits are used in a multi-chip module (CM). The connections between the sensing element and the circuitry is normally by way of one or more wire bonds and possibly a significant length of conductive track and bond pads and/or wires. Such wire bonds, tracks and bond pads act as parasitic capacitances loading the output and attenuating the signal to be amplified. The sensing circuitry may incorporate one or more junction field-effect transistors (JFET) in the amplifier input since JFET's have low current noise performance and low bias currents. Alternatively direct chip attach (DCA) techniques, such as the flip-chip solder bump technique, may be used to mount the MEMS chip directly on the readout application specific integrated circuit (ASIC) which serves to reduce the parasitics (capacitance, resistance and inductance of which capacitance is the most significant for this application) to some extent.

S. Amon et al, "Self-Aligned Gate JFETs for Smart MEMS—Modeling, Design and Fabrication", Journal of Modeling and Simulation of Microsystems, Vol. 1, No. 2, pages 105–108, 1999 discloses the integration of self-aligned gate (SAG) JFETs with MEMS devices (fabricated using ion implantation in bulk silicon with a substrate contact to the back of the wafer and implanted resistors) and the advantages provided by virtue of the fact that no epitaxial step is required in the fabrication process. J. J. Bernstein and J. T. Borenstein, "A Micromachined Silicon Condenser Microphone with On-Chip Amplifier", Solid State Sensor and Actuator Workshop, Hilton Head, S.C., Jun. 2–6, 1996 discloses a monolithic silicon microphone with an integrated JFET source follower where the JFETs were fabricated in bulk silicon using a combination of solid source doping and ion implantation with polysilicon resistors.

It is an object of the invention to provide a MEMS and a method for fabricating such a MEMS which enables the parasitic capacitances to be minimised so as to provide an improvement in the minimum detectable signal.

According to one aspect of the present invention there is provided a method of fabricating a micro-electromechanical system (MEMS) incorporating a sensing element and a junction field-effect transistor (JFET) electrically connected to the sensing element, the method comprising the steps of:
(a) forming a first layer of electrically insulating barrier material on a surface of a substrate;
(b) patterning the first layer so as to expose a first region of the substrate;
(c) doping by ion implantation the first region of the substrate to form a well region of the JFET;
(d) forming a second layer of barrier material on the surface of both the first layer and the first region of the substrate;
(e) patterning the barrier material so as to expose a part of the first region of the substrate;
(f) doping by ion implantation the exposed part of the first region of the substrate to form source and drain contact areas of the JFET;
(g) patterning the barrier material so as to expose a second region of the substrate; and
(h) doping by ion implantation the second region of the substrate to form gate and substrate contact areas of the JFET in a single implantion step.

According to a second aspect of the present invention there is provided a micro-electromechanical system (MEMS) comprising a substrate incorporating a movable element and an electrical sensing element providing an electrical output signal indicative of displacement of the movable element, wherein a junction field-effect transistor (JFET) is monolithically integrated on the substrate with the sensing element and is electrically connected to the sensing element so as to act as an impedance transformer rendering the output signal less sensitive to external effects (such as noise and parasitic or stray capacitive loading), and wherein gate and substrate contact areas of the JFET are formed on the same side of the substrate by a single ion implantation step.

According to a third aspect of the present invention there is provided a micro-electromechanical system (MEMS) comprising a substrate incorporating a sensing element and a junction field-effect transistor (JFET) electrically connected to the sensing element, the system being formed by the method of the first aspect.

The monolithic integration of the JFET of the sensing electronic circuitry with the MEMS enables the bond wires for interconnecting the sensing element and the associated sensing electronic circuitry to be provided only after the buffering stage of such circuitry. This means that the bond wires interconnecting the buffering stage and the remainder of the circuitry are connected to a low impedance node which is less sensitive to noise and parasitic capacitive loading. Thus greater detection accuracy can be achieved by virtue of the fact that the parasitic capacitances are reduced to a minimum.

Although, in theory, CMOS and BiCMOS analogue and digital electronic circuitry may be used for the sensing electronics of such MEMS, either as a stand-alone ASIC or fully integrated, it should be pointed out that there are a number of disadvantages associated with use of CMOS devices in such application. Firstly CMOS processing techniques can normally only be applied to [100] silicon substrate. Also the fabrication of CMOS, bipolar and BiCMOS devices is complex requiring many additional masking steps, and may limit mechanical materials selection and properties, as well as requiring a larger chip area and cost.

By contrast, the use of an integrated JFET considerably simplifies the fabrication process (typically to a 4 or 5 mask process) and enables larger geometry devices to be used which do not require sub-micron process capabilities (or features), thus rendering the device simpler and cheaper to produce.

It is particularly advantageous for the system to be formed using a silicon-on-insulator (SOI), silicon on-glass (SOG) or silicon-on-sapphire (SOS) substrate in the fabrication process since this allows mesa (trench) isolation to be employed for electrical isolation of individual JFET and sensing elements.

This permits the substrate potential of each JFET to be independently set if required for optimal circuit performance and cases circuit formation. Such substrates typically have thinner device layers and thus present higher resistance for in-plane current flow than their bulk equivalents. A further minor advantage is thus that the level of leakage current associated with each JFET through the silicon may be decreased.

The invention also provides a method of fabricating a micro-electromechanical system (MEMS), the method comprising the steps of applying a layer of a first material on a surface of a substrate of a second material, selectively patterning the first material so as to form a track extending between two areas of the surface, and deep etching the second material so as to form a trench between the two areas whilst leaving the patterned first material in place, the deep etching being adapted to undercut the second material beneath the track so that the track forms a bridge or cantilever across the trench.

BRIEF DESCRIPTION OF THE DRAWING

In order that the invention may be more fully understood, preferred embodiments of the invention will now be described, by way of example, with reference to the accompanying drawings, in which.

In order to fabricate the JFET in such a system, a simple, four-mask process may be used as described below with reference to FIGS. 2a to 2e showing sections through a portion of a substrate during successive fabrication steps.

The fabrication process to be described uses an n-type silicon wafer (typically of resistivity of around 10–30 ohm-cm) as a substrate, and a field oxide layer of a nominal thickness in the range of 0.2–1.0 µm, and typically about 0.35 µm, is grown by a wet oxidation process. A similar fabrication process may be used in accordance with the invention to produce an n-channel device in a p-type silicon wafer, but such devices tend to exhibit poorer noise performance. Furthermore somewhat similar fabrication processes may be used in accordance with the invention utilising dielectric layers other than the field oxide layer referred to above, and using alternative processing techniques, including such as LPCVD (low pressure chemical vapour deposition), PECVD (plasma enhanced chemical vapour deposition), spin-on thin films, evaporation, sputtering, etc.

Figure 2A:
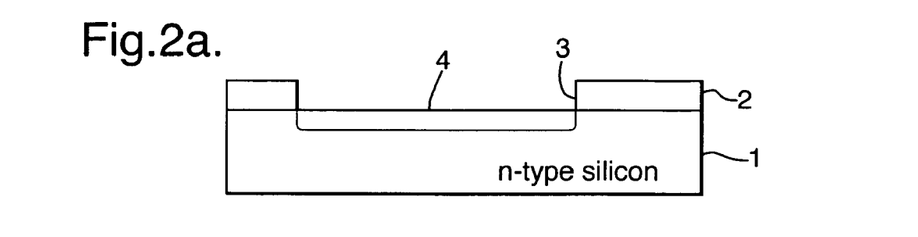
FIGS. 2a to 2e are diagrams showing successive steps in a fabrication method in accordance with the invention.
Figure 2B:
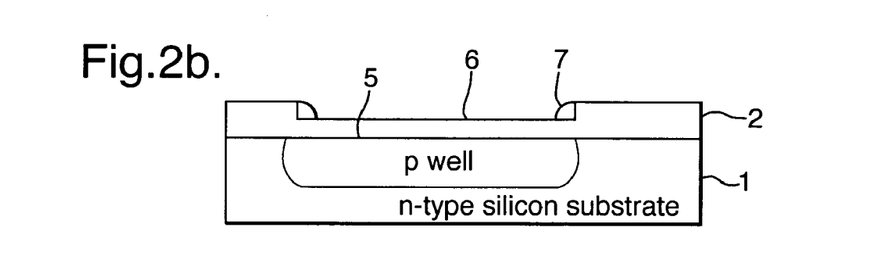

FIG. 2a shows the effect of a first lithographic process step in which a photoresist layer is initially applied on top of the field oxide layer and is then exposed to radiation through a mask prior to the exposed or unexposed areas of the photoresist being removed (depending on whether positive or negative tone photoresist is used) and a suitable etchant being applied to selectively etch those areas from which the photoresist has been removed. Alternatively the required patterning can by achieved by electron beam lithography. FIG. 2a shows the field oxide layer 2 on the substrate 1, and a window 3 which has been etched in the layer 2 in this manner. Doping of a region 4 of the substrate 1 is then effected by implantation of a p-type dopant, such as boron, through the window 3. In a further annealing step the dopant is driven in to form a small p-type well 5 as shown in FIG. 2b, and a well oxide layer 6 is grown above the p-type well 5. The thickness of the well oxide layer 6 is preferably approximately one half of the thickness of the thickened field oxide layer 2 covering the remainder of the substrate 1. This step renders the use of a separate substrate contact mask unnecessary, as will be apparent from the description of the following fabrication steps. If it is necessary for the p-type well 5 to be deepened after the well oxide layer 6 has been grown (or deposited) to the required depth, a further annealing step may be carried out in an inert ambient atmosphere.

Prior art JFET fabrication processes typically employ a contact on the back face of the substrate and typically involve fabrication in bulk silicon substrates. This is often as part of a full CMOS or bipolar fabrication process. Stand-alone JFET fabrication processes are considerably more complex than the process described with reference to FIGS. 2a to 2e, typically employing more masking steps.

Furthermore, if it is necessary to reduce the substrate leakage current from the edge of the JFET (such leakage being primarily by way of a parasitic bipolar transistor associated with the edge of the device), it is possible for a further step to be incorporated in the fabrication method in which a nitride spacer 7 is created around the edge of the well, as shown in FIG. 2b. This spacer 7 can be produced by depositing a nitride layer, typically of a thickness of about 0.3–1.0 µm, on top of the oxide layers 2 and 6, and then blanket etching the nitride layer using an anisotropic etch process leaving the required spacer 7 at the well edge. The skilled person will appreciate that this could also be done with oxide if it is acceptable to sacrifice etch selectivity to the top of the barrier layer (which is also of oxide). The spacer acts to level shift the turn-on voltage of the parasitic bipolar transistor above the pinch-off voltage of the JFET.

Figure 2C:
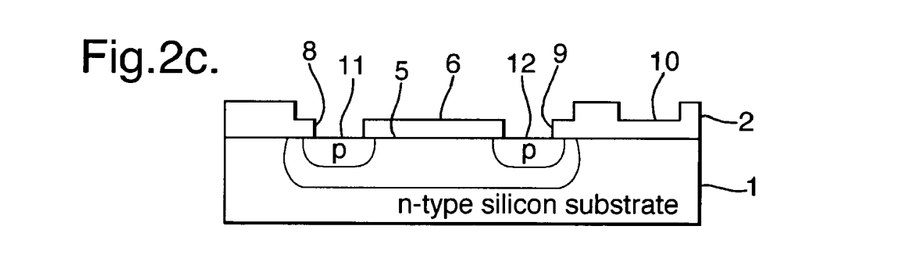

In a second lithographic process step a layer of photoresist applied to the upper surface of the substrate is selectively exposed through a further mask, and the exposed or unexposed areas of photoresist are removed prior to etching of the well oxide layer 6 to form contact windows 8 and 9 for the source and drain of the JFET, as shown in FIG. 2c. At the same at least one etched recess 10 may be formed in the thickened oxide layer 2 by such an etching process. It is important that the recess 10 is separated from the substrate 1 by a remaining thickness of oxide, typically amounting to approximately half the thickness of the unetched parts of the oxide layer 2. In a further doping step a $p^+$-type dopant is implanted in the p-type well 5 through the windows 8 and 9 to form source and drain contact areas 11 and 12 within the substrate 1. The remaining oxide layer separating the recess 10 from the substrate 1 needs to be sufficient to ensure that such doping does not reach the area of the substrate below the recess 10.

Figure 2D:
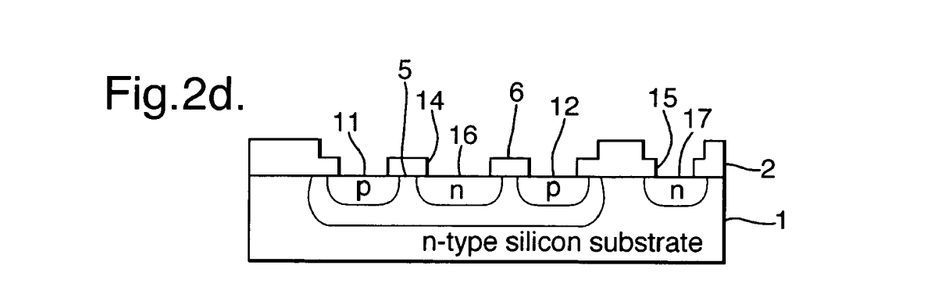

In a third lithographic process step a layer of photoresist applied to the upper surface is selectively exposed through a further mask and, after removal of the exposed or unexposed photoresist, contact windows 14 and 15 are etched in the oxide layers 2 and 6, as shown in FIG. 2d, the window 15 extending through the remaining oxide previously separating the recess 10 from the substrate 1. In a further doping step a $n^+$-type dopant is implanted through the windows 14 and 15 to form gate and substrate contact areas 16 and 17 in the substrate 1. The source and drain contact areas 11 and 12 are protected by the photoresist mask from the gate and substrate contact implant. At the end of each cycle, the photoresist mask is removed. Such a mask could also be used to define other implants (e.g. source and drain contacts or well) without the need for the formation of an oxide layer.

Annealing of the wafer in dry oxygen serves to activate the dopants and to drive the gate contact area 16 to the required depth in the p-type well 5. During this annealing step a relatively thin oxide layer is formed in the contact windows. The surface is then blanket etched to remove the relatively thin layer of oxide in the contact windows, and a layer of a suitable metal, such as an aluminium alloy, Ti, TiW alloy, Au, Cr, Cu, W, Ni, Cr, NiCr alloy, TiN (titanium nitride), Pt and combinations thereof for example, is deposited.

Annealing and activation of the implanted dopants may alternatively be undertaken in an inert atmosphere such as argon or nitrogen. In such cases there may not be a thin oxide grown on the surfaces of the exposed silicon and therefore there may be no need to perform a blanket etch prior to depositing the metal layer.

Figure 2E:
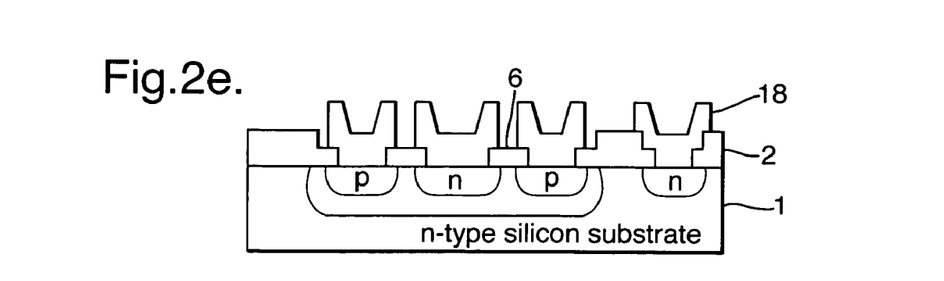

In a fourth lithographic process step a layer of photoresist applied to the metal layer is then selectively etched through a further mask to define the required metallisation pattern, and, after removal of the exposed or unexposed photoresist, the metal is removed by etching in the areas in which it is not required leaving the metallisation tracks 18 in place. The metallisation could alternatively be patterned by milling or by lift-off processing (involving application of pattern photoresist prior to metal deposition and lift-off).

The above-described fabrication scheme is particularly advantageous as it requires the use of only four different masks to form the required doped areas within the substrate 1 together with the metallisation for the required connections to the JFET and the sensing element of the MEMS. The process is therefore relatively inexpensive, and furthermore is compatible with both n-type and p-type well designs. As previously indicated the parasitic leakage path from the edge of the gate of the JFET to the substrate can be reduced using a spacer 7 which can be formed without requiring an additional mask.

Alternatively such a parasitic leakage path may be eliminated using an annular transistor design which requires oxide isolation and contact holes, although this requires use of an additional mask to define the contact holes. This will be described further below with reference to FIG. 4.

In a further optional step which may be added to the fabrication process, high resistance biasing resistors are formed by implantation at the same time as the p-type well 5 is formed, windows for the resistors being formed at the same time as the window 3 defining the well so that no further masking step is required. Alternatively such resistors may be defined by use of a further masking step prior to the first masking step for defining the p-type well 5 to define a resistor pattern in an additional polysilicon layer deposited on the field oxide. This further masking step followed by selective etching enables windows to be produced in the oxide layer through which a low dose dopant may be implanted to form the resistors. In either case $p^+$-type contact areas and metallisation tracks are required at the ends of the resistors so formed. In certain applications, this further step may form part of the MEMS process, being effected, for example, by polysilicon surface micromachining or in a thin metallic layer of suitable resistivity (of TiN or TiW for example).

In SOI or SOG substrates, such resistors could also be formed by a length of silicon defined by etching channels in the silicon device layer down to the underlying insulating layer with dimensions to define the required resistance R according to the relationship R=ρl/h w, where ρ is the resistivity of the silicon, 1 is the length of the resistor, h is its depth and w is its width. Highly doped regions may be formed via implantation for contacts as required. Substrate contacts in regions with a JFET may limit the practical application of this approach.

The described fabrication processes can be used to readily fabricate a JFET which is integrated with a MEMS sensor. Typically the JFET is fabricated on the wafer prior to the application of deep reactive ion etching (DRIE) required to form the sensing element of the MEMS. If high aspect ratio machining (HARM) is used in a silicon-on-insulator (SOI) or silicon on-glass (SOG) fabrication process, the process flow steps may be as follows. The JFET is first fabricated using the sequence of steps already described up to immediately prior to the metallisation step. The metallisation step follows, typically being common to both the JFET and the MEMS production process. The MEMS structures are then defined using deep reactive ion etching (DRIE). As will more readily be appreciated by referring to the description of a preferred MEMS sensor given with reference to the drawings of WO 00/16041, release etching (wet, vapour phase or plasma-based) may be necessary to free structures of the MEMS from the adjacent layer(s), and it may be necessary to protect the active circuits during the release process since aluminium alloys (if used) and/or silicon oxide (if used) are attacked by HF which may be used in such a process. The required protection may be provided by a protection layer, such as a layer of photoresist, polyamide, PECVD silicon nitride or other HF-resistant layer and combinations thereof.

In some applications, it may be preferable to define the metallisation after the DRIE step to enable air bridges and/or dielectric or polymer trench refill to be employed (as described in copending patent application Ser. No. 9819817.9) for mesa (or trench) isolation of individual JFET devices. This allows each JFET to have an independent substrate voltage and hence provides better matching of device characteristics in circuit implementations. In other applications more than one metallisation step may be provided either before or after the DRIE and release step for added flexibility at the cost of increased process complexity. In alternative process flow sequences, the metallisation step may be carried out as a final step, that is after release of the MEMS structures, using shadow masking and evaporation or sputtering (or some other metal deposition technique, such as electroplating or CVD). Furthermore the JFET may be produced on top of a mesa in the silicon if this is of sufficient area. It should also be noted that DRIE may be used to form high value trench capacitors with appropriate refill. In a further development of the invention described hereinbelow a bridge structure across a trench is formed by DRIE.

To enable the JFET to be used for buffering applications, it may be necessary to incorporate a high resistivity polysilicon layer within which resistors can be defined for biasing the JFET. This is estimated to require one additional mask for edgeless device architectures and two additional masks for a simple spacer-based process. Using a diode to bias the JFET is an alternative choice that avoids the added complexity of additional processing steps and presents a large impedance as the diode is reverse biased when looking from the gate of the JFET. The diode can be formed using the 4 mask layers outlined above. The diode will be small and will be electrically connected to the gate of the JFET device. A low impedance voltage would be applied to the other end of the diode to establish the DC operating point of the JFET device. The effective resistance value of the diode will depend on the area of the diode and the magnitude of the voltage at the gate of the JFET.

As the skilled person will appreciate, the JFET could also be integrated with a sacrificial surface micromachining process employing materials such as polysilicon, metal or metal-nitride for the mechanical layer. Typically the JFET would be fabricated in a step immediately prior to the metallisation step and the metallisation would added as part of the main surface micromachining process flow. If this involves high temperature (>700 C) processing steps, then the layout and anneal cycles of the JFET process may need to be adjusted to allow for this. Such effects may be readily modelled using industry-standard process and device simulators obtainable from companies such as Silvaco, TMA, Avanti, Mentor and Cadence.

Figure 3:
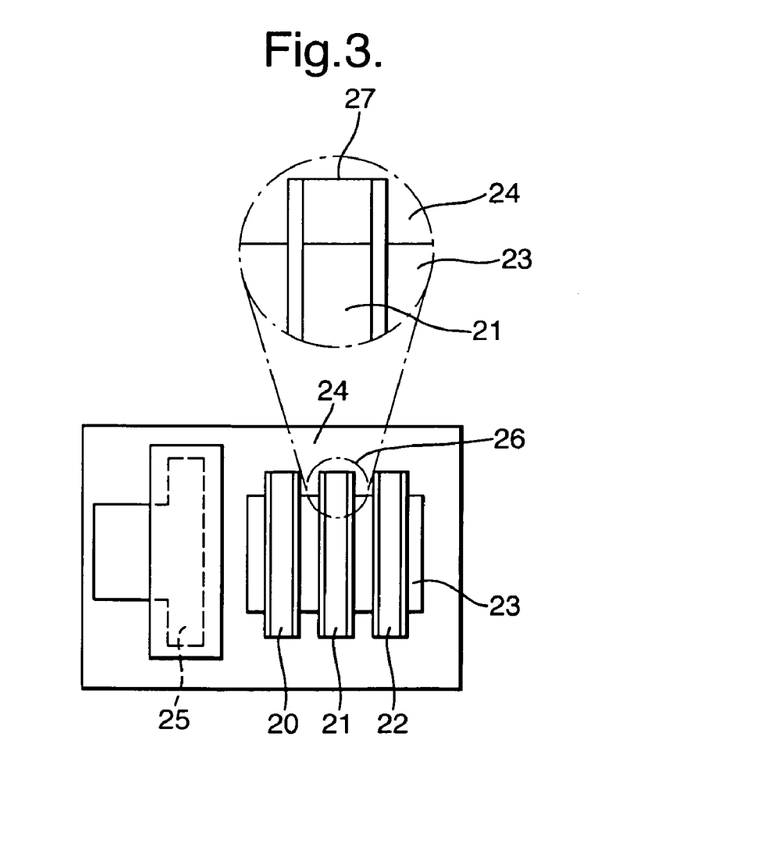
FIGS. 3 and 4 are layout diagrams of embodiments of the JFET portion of the MEMS in accordance with the invention.

FIG. 3 shows a possible layout for the system in which source, gate and drain metallisation electrodes 20, 21 and 22 overlie the p-type well 23 in registry with the $p^+$ contact area, the $n^+$ gate contact area and the $p^+$ drain contact area respectively so as to overlap the n-type silicon substrate 24, and a substrate contact metallisation electrode 25 is provided in registry with the $n^+$ substrate contact area so as to also overlap the substrate 24 surrounding the substrate contact area. An enlarged detail of the part of the JFET denoted by the square overlay 26 is shown at 27 from which it will be appreciated that the overlap between the electrode 21 and the p-type well 23 and the n-type surrounding substrate 24 serves to form a parasitic $n^+$-p-n edge transistor connected to the gate of the JFET. Such a parasitic edge transistor (bipolar) is undesirable in some applications as it may turn on before the JFET leading to high leakage currents.

Figure 4:
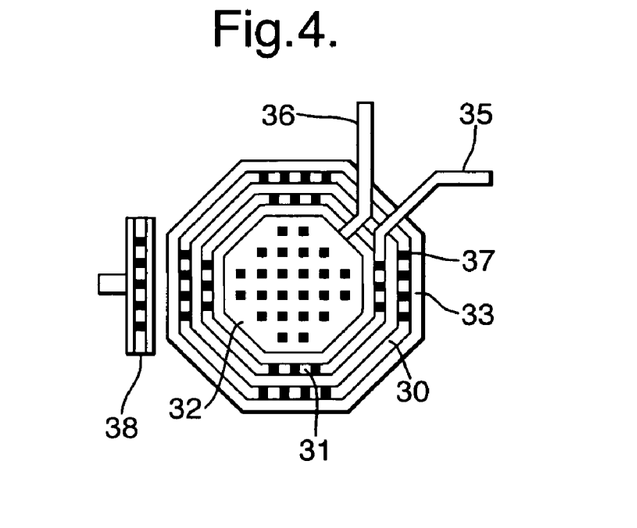

FIG. 4 shows the layout of an alternative edgeless design in which a source metallisation electrode 30 surrounds a gate metallisation electrode 31 which in turn surrounds a drain metallisation electrode 32, and the electrodes 30, 31 and 32 are in registry with correspondingly shaped source, gate and drain contact areas formed within the p-type well 33. Narrow metallisation tracks 35 and 36 extend through gaps in the electrodes 30 and 31 in order to provide electrical connections to the electrodes 31 and 32. Such an edgeless design substantially eliminates the parasitic edge transistor effect. However, in this case, a fifth mask is required to define contact holes 37 through an insulating layer for interconnecting the electrodes 30, 31 and 32 and the associated contact areas. Similarly such contact holes are provided for connecting a substrate contact metallisation electrode 38 to the underlying substrate contact area.

The further processing to produce this design requires deposition of a low temperature oxide (LTO) layer prior to metallisation and after the dry oxygen annealing step, and etching of contact holes through this layer after patterning using the fifth mask and before deposition and definition of the metallisation. This LTO layer may be deposited by LPCVD (low pressure chemical vapour deposition) or PECVD (plasma enhanced chemical vapour deposition) typically at a temperature below 425° C. so that it may be deposited on top of an Al metallisation scheme, and serves to insulate the tracks 35 and 36 from the underlying contact areas. In this context low temperature means any process carried out at temperatures under approximately 700° C., as temperatures above 700° C. can cause diffusion of implants in the silicon at rates such that the device characteristics may be adversely affected, depending on the temperature and the time of exposure. Thus the implant profile and dose, as well as the duration and temperatures of processes carried out above these temperatures (such as thermal oxidation and anneals), need to be well known and reproducible in order to produce devices with the desired characteristics. Typically the process is optimised by varying the implant anneal time. Such trends may be modelled using process simulation software.

In a preferred implementation the JFET and associated fabricated components constitute a buffering circuit acting as an impedance transformer which accordingly vastly reduces the parasitic effect of the bond wire connecting the MEMS sensing element to external detection circuitry, thus increasing the signal: noise ratio of the detection circuit as a whole. A source follower circuit may be used with one or more associated active devices, capacitors and resistors. In its simplest form, this source follower circuit requires only a single JFET in the circuit.

Figure 5:
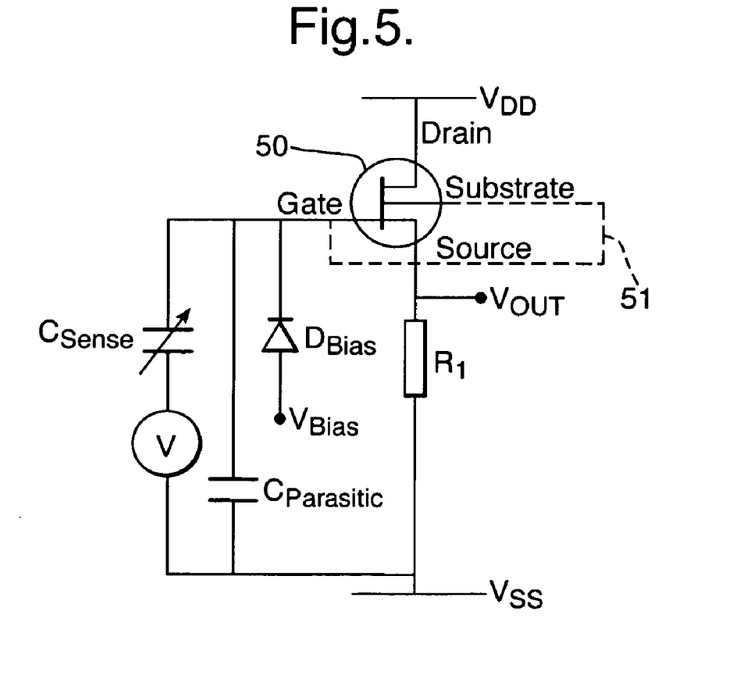
FIGS. 5 and 6 are circuit diagrams of two preferred embodiments of MEMS in accordance with the invention.
Figure 6:
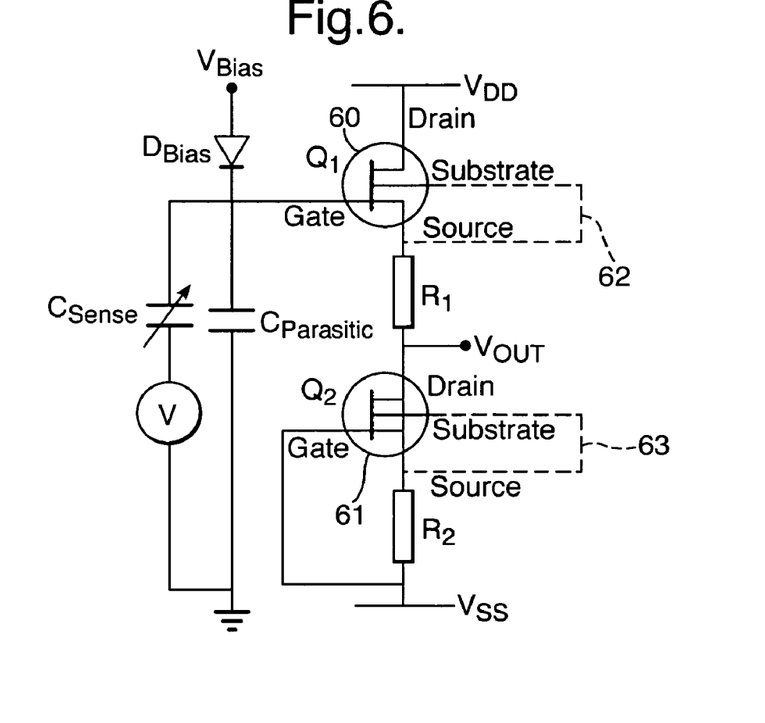
Figure 7:
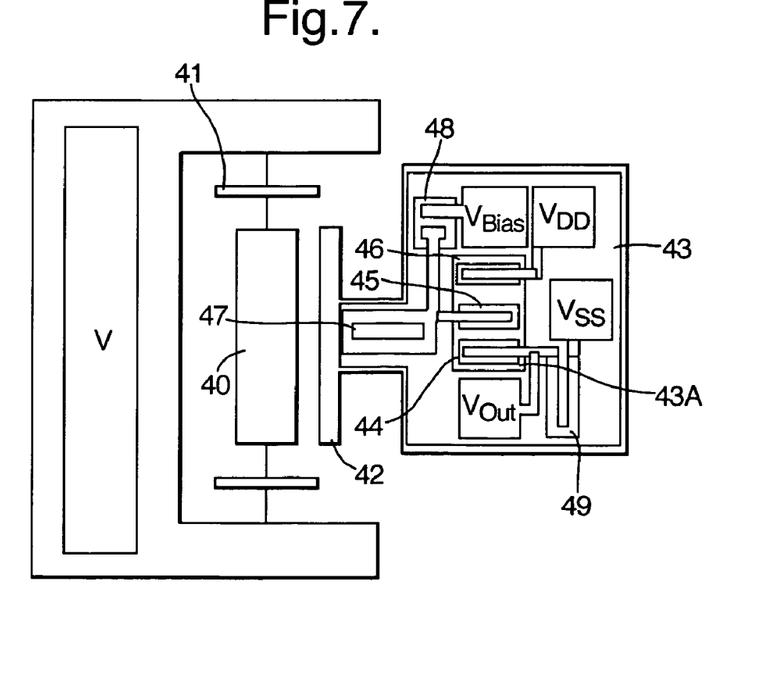
FIGS. 7 and 8 show the preferred layouts of the integrated circuits of the embodiments of FIGS. 5 and 6 respectively.
Figure 8:
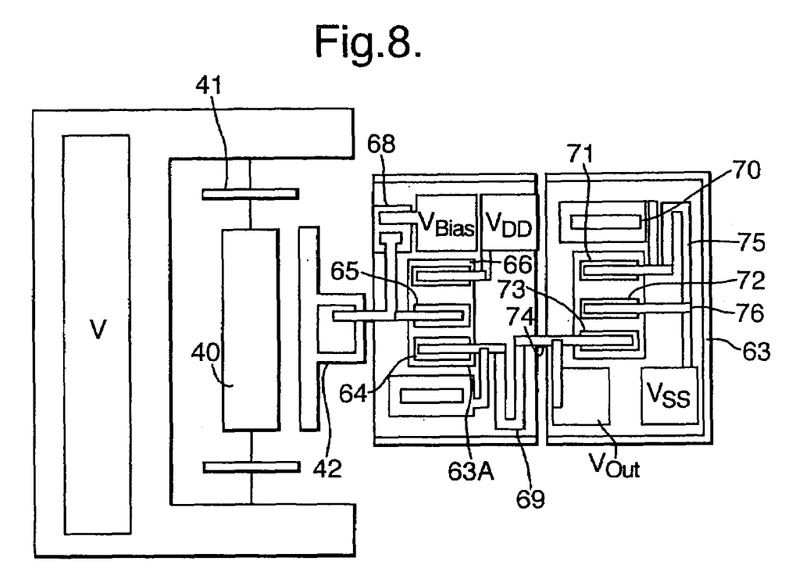

Two preferred circuit implementations are shown in FIGS. 5 and 6, and corresponding schematic representations (not to scale) of the resultant circuits implemented on silicon with a generic sensing element are shown in FIGS. 7 and 8. In each case the generic sensing element comprises an electrode in the form of a movable mass 40 supported by a sprung suspension 41 forming a sensing capacitor with a fixed electrode 42. Each of these circuits requires to be connected to four bond wires are required, that is two wires serving as the power rails for the circuit, one wire to provide the bias for the JFET and one wire to take the output signal off-chip.

In the first preferred embodiment shown in FIG. 5, a single JFET 50 is used as a source follower (with an associated biasing diode $D_{Bias}$ and load resistor $R_1$) from a capacitive sensing element input. The source of the JFET is connected to $V_{SS}$ (tpyically $V_{SS}$=0V in this configuration) by the load transistor $R_1$, and the output is provided at the junction between the source and the load resistor $R_1$. Furthermore the substrate is connected to the gate as indicated by the broken lines 51. In a variant, however, the substrate may be connected to the source. Such a circuit is advantageous in that it is a small footprint circuit and is therefore most suited to integration on an electrode of the sensing element itself. In this case the sensing electrode is an isolated mesa, as shown in FIG. 7.

Figure 9:
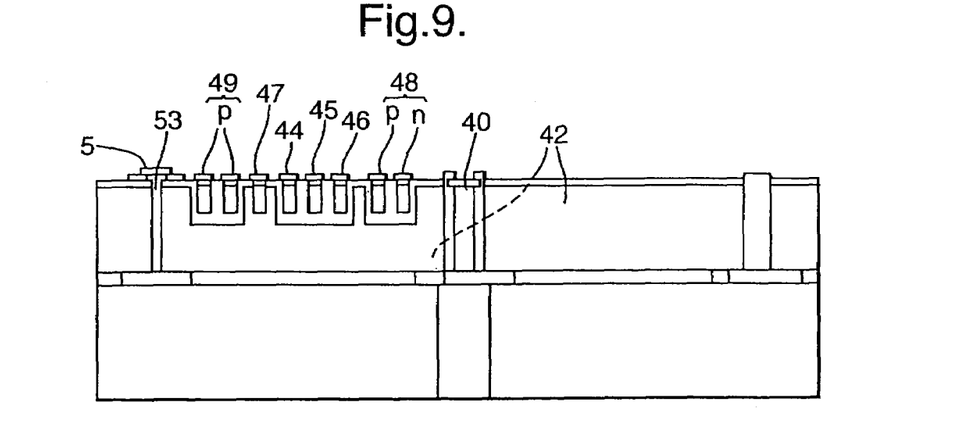
FIG. 9 is a cross-section through the layout of FIG. 7.

The circuit layout of FIG. 7 is suitable for use in a 4 mm diameter ring gyroscope of the form disclosed in WO 00/16041 which incorporates sensing electrodes of an adequate footprint to include this circuit, having a surface area in excess of $10^5$ μm². Such a circuit would only be used where necessary, for example for the sensing of secondary (rate-of-turn) signals close to the noise level present in the device. The layout incorporates four conductive bond pads, provided on an oxide layer on a n-type silicon substrate 43, indicated by $V_{Bias}$, $V_{DD}$, $V_{SS}$ and $V_{out}$ for the attachment of bond wires connecting the circuit to external circuitry. Furthermore the layout incorporates a p+ source 44, a n+ gate 45 and a p+ drain 46 provided in a p-doped well 43A of the JFET, as well as a n+ substrate contact 47, a biasing diode 48 and a polysilicon or p-well load resistor 49, interconnected by metallisation tracks as appropriate. A cross-section through such a layout is shown in FIG. 9, the interconnecting metallisation tracks being omitted for clarity. A metal air bridge 52 is shown spanning a trench 53 between two mesas.

In the second preferred embodiment shown in FIG. 6, two JFETs are employed, that is a first JFET 60 serving as a source follower from a capacitive sensing input, and a second JFET 61 serving as a current source (active load) provided with two matched load resistors $R_1$ and $R_2$. The use of two closely matched JFETs 60, 61 in such an arrangement provides improved performance and temperature tracking. In order to take full advantage of the matching, the substrate contacts of the JFETs 60, 61 should be independently settable, preferably by being isolated from one another. To this end mesa isolation is employed with metal air bridges being provided between the mesas (and between the electrode and the mesas) for interconnection of the two parts of the circuit, as shown in the layout of FIG. 8.

The source of the JFET 60 is connected to the drain of the JFET 61 by the load transistor $R_1$, and the source of the JFET 61 is connected to ground by the load resistor $R_2$ The gate of the JFET 61 is connected to $V_{SS}$, and the output is provided at the junction between the load resistor $R_1$ and the drain of the JFET 61. Furthermore the substrate is connected to the source of each JFET 60, 61 as indicated by the broken lines 62, 63.

The circuit layout of FIG. 8, which is again only employed in situations where it would be of significant benefit, incorporates four conductive bond pads, provided on an oxide layer on a n-type silicon substrate 63, indicated by $V_{Bias}$, $V_{DD}$, $V_{SS}$ and $V_{out}$ for the attachment of bond wires. Furthermore the layout incorporates a p+ source 64, a n+ gate 65 and a p+ drain 66 provided in a p-doped well 63A of the first JFET, as well as a biasing diode 68 and a polysilicon or p-well load resistor 69, interconnected by metallisation tracks as appropriate. However, in this embodiment, the layout also includes a p+ source 71, a n+ gate 72 and a p+ drain 73 of the second JFET, as well as an air bridge 74 and a polysilicon or p-well load resistor 75, interconnected by metallisation tracks such as 76. The air bridge permits electrical interconnection of the two JFETs provided on two mesas isolated from one another by means of a trench in known manner. An additional implant and diode isolation could be used to isolate the devices, but only at the cost of added process complexity.

In a further, non-illustrated embodiment, a differential amplifier circuit provides a differential output dependent on signals received from two sensing electrodes provided on opposite sides of the ring of a gyroscope. In this case the circuit comprises two JFETs connected back-to-back (with associated biasing diodes and a common load (a resistive or an active JFET load) receiving inputs from respective capacitive sensing elements. The drain of each JFET is connected to the supply rail by a respective resisistor, and the outputs are provided at the junctions between the drains and the resistor.

Furthermore it is advantageous for certain MEMS devices to take advantage of the different properties of different crystal orientations of silicon substrate. An example of these different properties is the fact that Young's modulus varies with radial angle in [100] silicon whilst Young's modulus is isotropic in [111] silicon. An important advantage of use of a JFET is such an integrated device is that the JFET may be monolithically integrated either on a [100] silicon substrate or on a [111] silicon substrate (using slightly different process details but the same basic sequence of steps and masks). It is also believed that other silicon substrate orientations, such as [110], could be accommodated with only minor JFET process engineering, for example by varying anneal and thermal oxidation times.

An example of a MEMS device in which such an arrangement is particularly advantageous is a ring gyroscope formed on a SOI or SOG substrate. Such a device may be based on [111] silicon for which a JFET offers the most viable solution for monolithic integration. It may also be preferable to monolithically integrate only the bare minimum of circuitry with the MEMS before routing off-chip to the remainder of the electronic circuitry, using either a bond wire or solder bump. The remainder of the circuitry may be in the form of a dedicated ASIC fabricated in a stand-alone CMOS process at minimum cost on standard [100] silicon. This helps to maximise the yield of the system as both the ASIC and the minimally integrated MEMS chip may be tested prior to assembly.

The electrodes of the MEMS sensing element may themselves be sufficiently large to contain the associated buffering circuitry on top of them together with an associated bond pad for connection to any off-chip circuitry. Thus the total area of the MEMS die may not be effected by the incorporation of the JFET circuitry.

In some applications, the JFET circuitry may require the substrate surface to be of a certain resistivity, typically 0.1–5000 ohm-cm and more advantageously 10–20 ohm-cm, for optimal electronic performance. This may be in direct conflict with the MEMS requirement for the doping level of the layer, for example a highly doped layer (less than 0.01 ohm-cm) or a lightly doped layer (greater than 5000 ohm-cm). In this case it may be necessary to incorporate a layer at the appropriate doping level on the surface of the wafer or at least in the active regions. This may be achieved by using epitaxial growth, either in selected regions, or over the whole surface.

In a further development of the invention a novel approach is adopted for realising an interconnection track between two mesas as shown, for example, in the circuit layouts of FIGS. 7 and 8 in such a manner as to solve the problems inherent in forming metallisation between isolated islands in high topography devices. In this approach the deposited metallisation is patterned before the DRIE step to define the MEMS device to provide a narrow metal track between the two mesa areas. It is a feature of deep dry etching with a mask that the etching process slightly undercuts the mask prior to etching anisotropically down. Thus, provided that a suitably narrow interconnection track is provided, the silicon underneath the track will be completely removed during the dry etching process. As a result the track will form a planar bridge across the continuous trench between the two mesas in spite of the track acting as a mask during the etch. It should be noted that substantially no silicon remains beneath the bridge 60 after etching, and that the bridge 60 is in the plane of the metallisation on the two mesas.

Preferably the track is protected by a line of resist during the etching. Furthermore the arrangement is preferably such that the bridge is short and the stress level in the bridge is slightly tensile to avoid buckling. Typical ranges for the bridge width are 0.1–50 μm (preferably approximately 1 μm) and for bridge length are 1–200 μm (preferably 2–20 μm). One potential advantage of such a bridge structure is that the bridge is less sensitive to stress as the bridge structure will remain essentially planar (if the layer is tensile).

This novel approach has advantages over a process in which a metal track is patterned over a silicon bridge and then the bridge removed by post-processing (e.g. using $XeF_2$) as it saves additional process steps and does not compromise gap sizes in capacitive structures formed in the main silicon etch step for sensing and actuation (e.g. comb drives and parallel plate capacitors).

A wet release process is typically employed (HF-based), in which case the metallisation must be HF resistant. Thus TiW and/or TiN are preferred adhesion/barrier layers with Pt and/or Au being used for an upper metallisation layer. Cr is a possible alternative adhesion/barrier layer. The barrier layer may be attacked slightly during deep dry etching in the portions being undercut, so that it is preferable to provide an upper metallisation layer. Where the substrate is pre-cavitated, no such HF-resistance is required and hence Al-based metallisations may similarly be employed.

This development is not limited to silicon-on-insulator (SOI) devices but is equally applicable to silicon-on-glass (SOG) and silicon-on-sapphire (SOS) devices, as well as being applicable to bulk silicon devices where etched mesas are isolated by diode isolation, etc. Furthermore, although the above discussion is concerned with laterally undercutting the metal track to form a bridge in a DRIE process, it is also possible to utilise such an approach to provide a limited degree of undercut, for example to use wet anisotropic etching to define a silicon device.

If desired, an HF-resistant insulating layer, made for example of silicon nitride rather than the previously discussed silicon oxide, may be employed prior to metallisation to permit tracking on a silicon mesa, such as in a SOI MEMS process with integrated JFETs. This would require the previously described additional lithography level to permit contact windows to be defined to the silicon prior to metal deposition.

Such a process of undercutting a patterned structure on a surface to form a planar bridge structure using DRIE may be also be used in other applications. For example such a process may be used to form a series of cantilevers anchored on one side of a gap but not on the other so as to mechanically constrain the unattached end.

Such cantilevers may be fabricated in conductive materials (e.g. metals), semiconducting materials (e.g. polysilicon) or insulating materials (e.g. silicon nitride) according to application requirements.

The invention claimed is:

1. A method of fabricating a micro-electromechanical system (MEMS) incorporating a sensing element and a junction field-effect transistor (JFET) electrically connected to the sensing element, the method comprising the steps of:
   (a) forming a first layer of electrically insulating barrier material on a surface of a substrate;
   (b) patterning the first layer so as to expose a first region of the substrate;
   (c) doping by ion implantation the first region of the substrate to form a well region of the JFET;
   (d) forming a second layer of barrier material on the surface of both the first layer and the first region of the substrate;
   (e) patterning the second layer of barrier material so as to expose a part of the first region of the substrate;
   (f) doping by ion implantation the exposed part of the first region of the substrate to form source and drain contact areas of the JFET;
   (g) patterning the second layer of barrier material so as to expose a second region of the substrate; and
   (h) doping by ion implantation the second region of the substrate to form gate and substrate contact areas of the JFET in a single implantation step.

2. A method according to claim 1, wherein, prior to patterning of the second layer in step (e), the thickness of the second layer on the substrate is substantially less than the combined thickness of the first and second layers where these are superimposed on the substrate, so that sufficient barrier material remains to prevent ion implantation in the second region in step (f).

3. A method according to claim 1, wherein, in a further step to reduce gate-to-substrate leakage, a spacer is formed around the edge of a well formed by coating of the first region with the second layer.

4. A method according to claim 3, wherein the spacer is formed by forming another layer of barrier material on the second layer and by directionally etching said other layer over the whole of its extent to leave the spacer in the areas where the layer is thicker due to the underlying topology.

5. A method according to claim 1, wherein, during patterning of the barrier material so as to expose said part of the first region through which the source and drain contact areas are implanted, portions of the barrier layer are etched to expose said part and simultaneously further portions of the layer overlying the second region are etched only part of the way through the thickness of the layer.

6. A method according to claim 1, wherein an annealing step is provided for activating the doping.

7. A method according to claim 1, wherein a metallisation step is provided in which one or more metallisation layers are deposited and patterned to form electrically conductive connections to the contact areas of the JFET and the sensing element.

8. A method according to claim 7, wherein a further patterning step is provided in which contact holes are formed in a further layer of barrier material for establishing electrical contact between the electrical conductive connections and the contact areas.

9. A method according to claim 1, wherein a resistor forming step is provided in which at least one biasing resistor is formed by depositing and patterning a further layer of material and doping an area exposed by patterning to form the biasing.

10. A method according to claim 9, wherein the further layer of material is a polysilicon layer.

11. A method according to claim 1, wherein a biasing diode junction for biasing the JFET is formed by the fabrication steps.

12. A method according to claim 1, wherein each patterning step involves a lithographic process in which the layer is selectively exposed through a photoresist mask and the layer is selectively etched.

13. A method according to claim 1, wherein an epitaxial layer is formed at least in selected regions on the surface of the substrate.

14. A method according to claim 1, wherein a mechanical actuator of the MEMS is formed by deep reactive ion etching (DRIE), by anisotropic wet etching or by sacrificial surface micromachining.

* * * * *